United States Patent
Luce et al.

(10) Patent No.: US 10,811,251 B2
(45) Date of Patent: Oct. 20, 2020

(54) DIELECTRIC GAP-FILL MATERIAL DEPOSITION

(71) Applicant: Intel Corporation, Santa Clara, CA (US)

(72) Inventors: Jeanne L. Luce, Hillsboro, OR (US); Ebony L. Mays, Hillsboro, OR (US); Aravind S. Killampalli, Beaverton, OR (US); Jay P. Gupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/324,859

(22) PCT Filed: Sep. 30, 2016

(86) PCT No.: PCT/US2016/054711
§ 371 (c)(1),
(2) Date: Feb. 11, 2019

(87) PCT Pub. No.: WO2018/063303
PCT Pub. Date: Apr. 5, 2018

(65) Prior Publication Data
US 2019/0181003 A1    Jun. 13, 2019

(51) Int. Cl.
*H01L 21/02* (2006.01)
*C23C 16/56* (2006.01)
(Continued)

(52) U.S. Cl.
CPC ........ *H01L 21/02271* (2013.01); *C23C 16/56* (2013.01); *H01L 21/0217* (2013.01);
(Continued)

(58) Field of Classification Search
None
See application file for complete search history.

(56) References Cited

U.S. PATENT DOCUMENTS

| 2013/0149462 A1 | 6/2013 | Liang et al. |
| 2016/0020139 A1 | 1/2016 | Teng et al. |

(Continued)

FOREIGN PATENT DOCUMENTS

WO   WO-2016-065219    4/2016

OTHER PUBLICATIONS

International Preliminary Report on Patentability for International Patent Application No. PCT/US2016/054711 dated Apr. 11, 2019, 8 pgs.

(Continued)

*Primary Examiner* — Asok K Sarkar
(74) *Attorney, Agent, or Firm* — Schwabe, Williamson & Wyatt, P.C.

(57) ABSTRACT

A flowable chemical vapor deposition method including depositing a dielectric film precursor on a substrate in a flowable form; depositing an oligomerization agent on the substrate; forming a dielectric film from the dielectric film precursor; and curing the dielectric film under a pressure greater than atmospheric pressure. A method including depositing a dielectric film precursor as a liquid on a substrate in the presence of an oligomerization agent; treating the deposited dielectric film precursor to inhibit outgassing; and curing the dielectric film precursor to form a dielectric film. A method including delivering a dielectric film precursor as a vapor to a substrate including gap structures between device features; condensing the dielectric film precursor on the substrate to a liquid; flowing the liquid into the gap structures; and curing the dielectric film precursor under a pressure of 15 pounds per square inch gauge or greater.

30 Claims, 5 Drawing Sheets

(51) Int. Cl.
  *H01L 21/205* (2006.01)
  *H01L 21/768* (2006.01)
  *H01L 23/538* (2006.01)
  *H01L 23/498* (2006.01)
  *H01L 23/14* (2006.01)

(52) U.S. Cl.
  CPC .. *H01L 21/02164* (2013.01); *H01L 21/02167* (2013.01); *H01L 21/02219* (2013.01); *H01L 21/02263* (2013.01); *H01L 21/02274* (2013.01); *H01L 21/02321* (2013.01); *H01L 21/02326* (2013.01); *H01L 21/02329* (2013.01); *H01L 21/02337* (2013.01); *H01L 21/205* (2013.01); *H01L 21/76828* (2013.01); *H01L 21/76837* (2013.01); *H01L 23/5383* (2013.01); *H01L 23/147* (2013.01); *H01L 23/49827* (2013.01)

(56) References Cited

U.S. PATENT DOCUMENTS

2016/0093488 A1    3/2016    Thadani et al.
2016/0194758 A1    7/2016    Nemani et al.
2017/0335449 A1*  11/2017    Li ........................ C23C 16/36

OTHER PUBLICATIONS

International Search Report and Written Opinion for International Patent Application No. PCT/US2016/054711 dated Jul. 27, 2017, 11 pgs.

\* cited by examiner

DIELECTRIC GAP-FILL MATERIAL DEPOSITION

CROSS-REFERENCE TO RELATED APPLICATION

This patent application is a U.S. National Phase Application under 35 U.S.C. § 371 of International Application No. PCT/US2016/054711, filed Sep. 30, 2016, entitled "DIELECTRIC GAP-FILL MATERIAL DEPOSITION," which designates the United States of America, the entire disclosure of which is hereby incorporated by reference in its entirety and for all purposes.

BACKGROUND

Field

Integrated circuit processing.

Description of Related Art

Gap-fill is one of many operations in an integrated circuit chip manufacturing process. Dielectric gap-fill refers to the deposition of generally an insulating or dielectric material in gap structures to isolate densely packed features such as transistor devices in memory and logic chips. As devices scale in the deep-submicron process nodes (e.g., 32 nanometers (nm) and beyond), gap features are becoming extremely complex, making dielectric gap-fill technology critical. One area where such gap-fill is utilized is in non-planar or three-dimensional transistor architectures such as fin-based semiconductor architectures where a conductive channel of a device is disposed above a level of an insulating material on a substrate. Traditionally, fin-based devices are isolated from one another using a trench isolation process where an insulating or dielectric material is used to fill trenches or gaps between fins of three-dimensional architectures. For high aspect ratio fins and narrow spaces therebetween, existing gap-fill processes such as sub-atmospheric chemical vapor deposition (SACVD), low pressure CVD (LPCVD), plasma-enhanced CVD (PECVD), high-density plasma CVD (HDPCVD) and spin-on deposition (SOD) issues are presented such as seams and voids, substrate modification, surface sensitivity, adhesion issues, and shrinkage issues. For example, PECVD processes generally deposit material at a differential deposition rate that causes higher deposition to occur on horizontal surfaces than on vertical sidewalls. As a result, pinch-off can occur on the top of neighboring fins resulting in occlusion and formation of a void within the intervening trench. Deposition by atomic layer deposition (ALD) may result in the formation of seams within the trenches. The seams are susceptible to trapping undesirable material as the integrated circuit undergoes further processing.

DETAILED DESCRIPTION

Dielectric gap-fill techniques are disclosed. In one embodiment, a flowable chemical vapor deposition (FCVD) method is described wherein a dielectric film precursor is deposited on a substrate, such as a substrate including gap structures between features. The dielectric film precursor is vaporized and delivered to a CVD chamber in a gas phase. On the substrate, the dielectric film precursor condenses into a flowable form (e.g., a liquid) to flow into the gap structures, such as gaps or trenches between neighboring fins. In one embodiment, an oligomerization agent is deposited together with the dielectric film precursor. Without wishing to be bound by theory, it is believed the oligomerization agent contributes to a crosslinking of the dielectric film precursor and thereby reduces a vapor pressure of the dielectric film precursor which increases deposition rate. The condensed liquid is then treated to inhibit outgassing and then cured to promote crosslinking. Through curing the flowable dielectric can be converted, for example, to an oxide, a nitride, or a carbide as desired for a given target application and use. In one embodiment, the curing or treatment to promote crosslinking includes application of a pressure greater than an atmosphere pressure and, in one embodiment, at a pressure of 100 pounds per square inch gauge (psig) (about 5931 torr) or greater. In some embodiments, the resulting dielectric layer or film is formed with minimum shrinkage (e.g., less than 40 percent shrinkage) and may be substantially defect free, exhibiting no or an otherwise reduced quantity of seams/voids. A dielectric layer as described is suitable for applications including, but not limited to, shallow trench isolation, as an interlayer dielectric (e.g., ILD0) or any dielectric gap-fill application including high aspect ratio processes.

Figure 1:
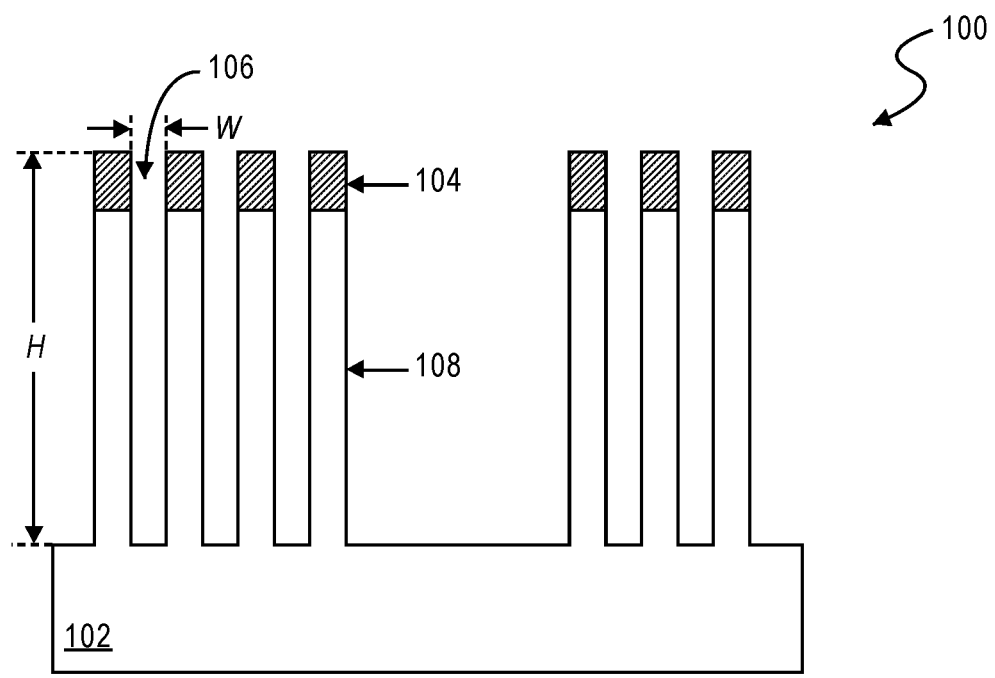
FIG. 1 shows a cross-sectional view of an integrated circuit (IC) structure including a number a fin structures formed therein.

FIGS. 1-4 illustrate an embodiment of an integrated circuit (IC) fabrication process flow. FIG. 1 shows a cross-sectional view of an integrated circuit structure including a number of semiconductor bodies or fin structures formed there. FIG. 5 presents a flow chart of the described process. Referring to FIG. 1, structure 100 includes substrate 102 of any suitable semiconductor material (or combination of such materials), such as, for example, silicon (Si) and/or silicon germanium (SiGe). Also, substrate 102 can have any of a wide range of configurations, including, for example: a bulk substrate; a silicon-on-insulator (SOI) structure; a wafer; and/or a multi-layered structure. Furthermore, the dimensions of substrate 102 can be customized as desired. As will be appreciated in light of this disclosure, it may be desirable to ensure that substrate 102 is of sufficient thickness, for example, to permit formation of one or more semiconductor bodies or fins 108 (discussed below) which are of sufficient dimensions for a given target application or end-use. Other suitable materials, configurations, and dimensions for substrate 102 will depend on a given application and will be apparent in light of this disclosure.

Structure 100 also initially may include hardmask layer 104 formed on a surface of substrate 102. Hardmask layer 104 can be formed from any suitable hardmask material (or combination of such materials). For example, in some embodiments, hardmask layer 104 can be formed from: a nitride, such as silicon nitride ($Si_3N_4$) or titanium nitride (TiN); an oxide, such as silicon dioxide (SiO$_2$); silicon carbon nitride (SiCN); silicon oxynitride (SiO$_x$N$_y$); and/or a combination of any one or more thereof. Other suitable materials for hardmask layer 104 will depend on a given application and will be apparent in light of this disclosure.

Hardmask layer 104 can be formed using any suitable technique (or combination of techniques). For example, in accordance with some embodiments, hardmask layer 104 can be formed using, for example, a chemical vapor deposition (CVD) process; a physical vapor deposition (PVD) process (e.g., sputtering); spin coating/spin-on deposition (SOD); electron beam evaporation; and/or a combination of any one or more thereof. A thickness of hardmask layer 104 can be customized as desired for a given target application or end-use. In some instances, hardmask layer 104 may have a substantially uniform thickness over the topology provided, for example, by underlying substrate 102. In some instances, hardmask layer 104 may be provided as a substantially conformal layer over such topology. In other instances, hardmask layer 104 may be provided with a non-uniform or otherwise varying thickness over such topology. For example, in some cases a first portion of hardmask layer 104 may have a thickness within a first range while a second portion thereof has a thickness within a second, different range. Other suitable dimensions for hardmask layer 104 will depend on a given application and will be apparent in light of this disclosure.

Hardmask layer 104, in one embodiment, is utilized to form a pattern on substrate 102 for forming semiconductor bodies or fins. Patterning of hardmask layer 104 can be performed using any suitable lithography technique (or combination of such techniques), as will be apparent in light of this disclosure. The dimensions (e.g., width) of the openings patterned into hardmask layer 104 may contribute to determining, at least in part, the width (W) of the one or more underlying trenches 106 (discussed below) that may be patterned into substrate 102.

As can be seen in FIG. 1, in one embodiment, substrate 102 is patterned to define a quantity of trenches or gaps 106 formed therein. Patterning of substrate 102 with one or more trenches 106 can be performed using any suitable lithography technique (or combination of such techniques), including, for example, wet etch and/or dry etch processes followed by polishing, cleans, etc., as typically done. In some embodiments, structure 100 may undergo highly directional (e.g., anisotropic) dry etching through patterned hardmask layer 104, etching into substrate 102 and forming one or more trenches 106 therein. Dimensions of the one or more trenches 106 can be customized for a given target application or end-use and may depend, at least in part, on the dimensions of overlying patterned hardmask layer 104 and/or patterning process(es) used to form the one or more trenches 106. In some embodiments, trench 106 may have a width (W), for example, less than or equal to about 50 nm (e.g., less than or equal to about 10 nm, less than or equal to about 20 nm, less than or equal to about 30 nm, or less than or equal to about 40 nm). In some instances, a given trench 106 may have a width (W), for example, in the range of about 5-15 nm. In some embodiments, a given trench 106 may have a height (H), for example, in the range of about 100-200 nm (e.g., about 125-145 nm, about 145-165 nm, about 165-185 nm, or any other sub-range in the range of about 100-200 nm). In a more general sense, and in accordance with some embodiments, a given trench 106 may be provided with a height-to-width (H/W) aspect ratio, for example, in the range of about 1:1 to 40:1, or a sub-range thereof, such as in the range of 10:1 to 40:1 or 10:1 to 20:1 (e.g., about 5:1 to 10:1, about 10:1 to 15:1, or about 25:1, or 30:1, or 35:1, or 40:1, or 45:1, or any other sub-range in the range of about 1:1 to 40:1). A geometry and/or spacing of one or more trenches 106 can be customized for a given target application or end-use and may depend, at least in part, on the dimensions of overlying patterned hardmask layer 104 and/or patterning process(es) used to form the one or more trenches 106. In some embodiments, a given trench 106 may have a generally well-like or trench-like configuration having a substantially rectangular cross-sectional profile as illustrated in FIG. 1. In one embodiment, a profile may include a rounded base or other shape that depends, at least in part, on the tooling available for form a trench. In some embodiments, a given trench 106 may have substantially vertical sidewalls (e.g., substantially perpendicular to the upper surface of the underlying substrate 102). In some instances, neighboring trenches 106 may be substantially equidistantly spaced from one another (e.g., may exhibit a substantially constant spacing within substrate 102). In other instances, however, the spacing of trenches 106 within substrate 102 may be varied as desired.

The patterning of substrate 102 with one or more trenches 106 results in the presence of one or more semiconductor bodies or fins 108 extending from substrate 102 (e.g., from an upper surface thereof, as can be seen in FIG. 1). In accordance with some embodiments, semiconductor bodies or fins 108 can be utilized, for example, in forming fin-based transistor devices and/or other suitable fin-based semiconductor architectures, as will be apparent in light of this disclosure. In another embodiment, semiconductor bodies or fins 108 may be sacrificial in the sense that they define an initial pattern for transistor devices or other architectures and then are replaced with another material (e.g., another semiconductor material or materials). The dimensions, geometry, and/or spacing of the one or more semiconductor bodies or fins 108 of substrate 102 can be customized as desired for a given target application or end-use. Semiconductor bodies or fins 108 are illustrated with a rectangular profile. It is appreciated that the actual profile of semiconductor bodies or fins will depend, at least in part, on process parameters such as the available tooling. Though a generally rectangular or otherwise quadrilateral profile may be targeted, the actual profile produced may be different and include, for example, rounded surface edges, uneven surfaces, etc.

Figure 2:
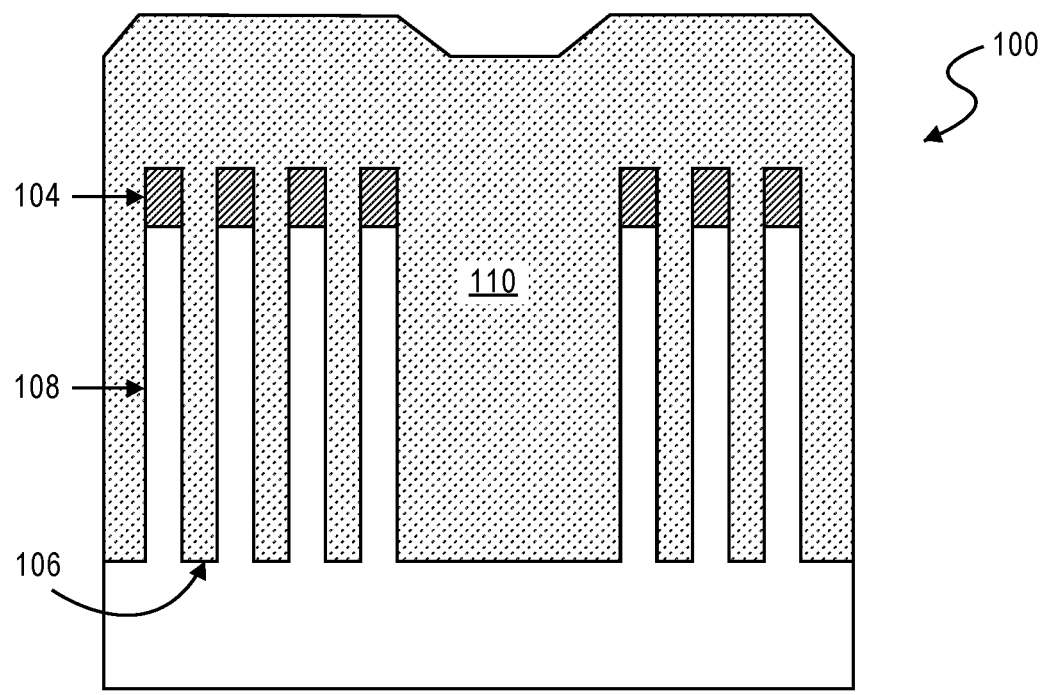
FIG. 2 shows the structure of FIG. 1 after deposition and curing of a dielectric film on the structure.

FIG. 2 shows the structure of FIG. 1 after deposition and curing of a dielectric film, in accordance with an embodiment. Dielectric film 110 may begin, in accordance with some embodiments, as one or more flowable dielectric material precursors which are deposited in a gas phase structure 100, cured and converted to produce an oxide-based, nitride-based, and/or carbide-based dielectric film 110. In some cases, resultant dielectric film 110 may be completely or substantially defect-free, exhibiting no seams/voids or an otherwise acceptable level of such defects for a given target application or end-use. In some instances, resultant dielectric film 110 may exhibit a reduced etch rate and/or improved electrical isolation. As will be appreciated in light of this disclosure, the various process conditions (e.g., pressure; temperature; composition of ambient environment) of deposition, curing, and/or conversion of the flowable constituent material(s) of dielectric film 110 can be customized as desired for a given target application or end-use.

Dielectric film 110 may begin as one or more flowable dielectric precursor materials that can be deposited over structure 100, for example, using a flowable chemical vapor deposition (FCVD) process, in accordance with some embodiments. In some such cases, the selected FCVD process may utilize remote plasma-enhanced CVD (RPECVD). In some such instances, using such a remote plasma process may help to maintain a low processing temperature, which in turn can help to maintain desired fluidity/flowability of the constituent material(s) of dielectric film 110.

Dielectric film precursor(s) can be flowed within the one or more trenches 106 and/or over an upper surface of patterned substrate 102, as desired. In some cases, it may be desirable to flow a sufficient amount of the precursor(s) so as to provide a sufficient overburden of dielectric film 110 with respect to semiconductive substrate 102 and its one or more semiconductive bodies 108 for subsequent processing (e.g., planarization and/or recessing, as discussed below with reference to FIGS. 3-4).

As previously noted, dielectric film 110 may begin as one or more precursors or constituent materials which are subsequently converted to an oxide-based, nitride-based, and/or carbide-based dielectric film 110, in accordance with some embodiments. To that end, in some embodiments, dielectric film 110 may begin, for example, as a flow of a dielectric film precursor or precursors in a gas phase into a chamber containing substrate 102 (e.g., a CVD chamber). Suitable dielectric film precursors include, but are not limited to silanes, such as silylamine (e.g., trisilylamine (TSA)) or a dichlorosilane, which can be oligomerized/polymerized to form polycarbosilane, polycarbosilazane, and poly silazane precursors to ceramics. It should be noted that the disclosure is not so limited, as in a more general sense, the individual precursor(s) and reactive gas(es), as well as their ratio, can be customized as desired for a given target application or end-use, in accordance with some embodiments. As will be appreciated further in light of this disclosure, it may be desirable to ensure that any selected precursor(s) of dielectric film 110 are: (1) flowable (e.g., compatible with deposition using a FCVD process); and/or (2) suitable for deposition within trenches 106 or other gap structures associated with relatively high aspect ratio features (e.g., having an aspect ratio in the range of about 10:1 to 40:1, in some cases). Other suitable materials for dielectric film 110 will depend on a given application and will be apparent in light of this disclosure.

In one embodiment, a dielectric film precursor(s) may be introduced in combination with or in the presence of an oligomerization agent such as an ambient environment of one or more ozone ($O_3$), oxygen ($O_2$), radicalized ammonia ($NH_3$) and/or other oligomerization agent. Without wishing to be bound by theory, it is believed that the oligomerization agent aids in the crosslinking of the dielectric film precursor(s) by reducing a vapor pressure of the dielectric film precursor(s) which increases deposition rate and the forming of the resulting dielectric film. Where an oligomerization agent is used, such oligomerization is used in an amount that facilitates deposition of the precursor(s) without inhibiting flowability. In some embodiments, the introduction of a dielectric film precursor(s) including TSA may be performed under a flow of $O_3$ having a flow rate, for example, in the range of about $2.0 \times 10^4$-$5.4 \times 10^4$ standard cubic centimeters per minute (sccm). In some embodiments, a dielectric film precursor(s) may be introduced under a flow of $O_2$ as an oligomerization agent having a flow rate, for example, in the range of about $2.5 \times 10^3$-$5.0 \times 10^3$ sccm. In some embodiments, an oligomerization agent is given a basic pH (e.g., adding radicalized ammonia to ozone, oxygen or steam).

As noted, the dielectric film precursor is delivered to a CVD chamber containing substrate 102 as a vapor (block 210, FIG. 5). In one embodiment, the chamber is cooled to allow the precursor to condense on substrate 102 (block 220, FIG. 5). A representative chamber temperature is a temperature below, at or near the boiling point of the dielectric film precursor(s). For TSA with an appropriate oligomerization agent, a representative temperature is on the order of 65° C. or less. If the deposition is performed at a temperature below a boiling of the precursor(s), the deposition may be done in the absence of an oligomerization agent. The dielectric film precursor(s) and optional oligomerization agent condense on the substrate as a liquid and the liquid flows into trenches 106.

Following the introduction and condensing and flowing of the condensed liquid of dielectric film precursor(s) on substrate 102, in one embodiment, the condensed liquid is then treated to inhibit outgassing (block 225, FIG. 5). Outgassing short-chain precursor material inside a trench can reduce the amount of a material in the trench which can lead to etch rate gradients. Accordingly, to reduce outgassing, the precursor(s) may be treated by one of several methods that crosslink some of the material, such as enough to form a semi-permeable skin or crust that slows a volatilization of the precursor(s) but does not crosslink a significant amount of the material (e.g., crosslinks less than 50 percent, less than 40 percent, less than 30 percent, less than 20 percent or less than 10 percent of the film). The crosslinking is selected, in one embodiment, to be sufficient to inhibit outgassing and leave the film permeable to, for example, a subsequent crosslinking promotion or cure process such wet oxidation (e.g., water) or gaseous oxidation (e.g., ozone) that can diffuse to a bottom of a feature. In one embodiment, such post-deposition treatment to inhibit outgassing includes a low temperature oxidation using a wet chemical technique. Representatively, a low temperature is a temperature below a volatilization temperature of the precursor(s). For a TSA precursor, a representative temperature for a post-deposition treatment is a temperature of 65° C. or less. An oxidation may be performed by the introduction of water. The oxidation proceeds to penetrate and crosslink a portion of the film, such as an exposed portion to create a crust to trap short-chain precursor molecules in the film.

In another embodiment, the post-deposition treatment is an ultraviolet (UV) treatment to create a semi-permeable crust that slows volatilization of the precursor(s) while still allowing exchange reactions in the material. A representative UV treatment is a wavelength of 200 nm to 400 nm for a few minutes in a pressure range of ambient to 200 torr.

In a further embodiment, the post-deposition treatment is a pressure treatment. A high pressure treatment is subjecting substrate 102 to a pressure environment that will lower a vapor pressure of the precursor(s) and allow crosslinking to, for example, create a crust to trap short-chain precursor molecules in the film. A representative pressure treatment for a TSA precursor is a pressure of 40 torr to 500 torr at a temperature that is less than a volatilization temperature (e.g., 65° C. or less for TSA).

A still further embodiment of a post-deposition treatment is the introduction of ozone in a gaseous state, for example, for several minutes, at a concentration sufficient to create a semi-permeable crust that slows volatilization of the flowable material while still allowing exchange reactions.

After deposition and post-deposition treatment, the dielectric film precursor(s) and optional one or more oligomerization agent may be cured on substrate 102 to promote crosslinking. In one embodiment, structure 100 is moved from a deposition chamber (e.g., a CVD chamber) to a second chamber such as a furnace for curing. In the furnace, in one embodiment, the structure is subject to a two-phase cure process to form a hardened dielectric film. In a first phase, structure 100 is subjected to relatively low temperature curing (block 230, FIG. 5). A low temperature cure is, for example, a cure at a temperature sufficient to propagate a crosslinking reaction such as a temperature of 80° C. to 300° C. or, in another embodiment, a temperature of 200° C. to 300° C. for one to three hours (e.g., two to three hours) at close to atmospheric pressure (e.g., 0 psig to 30 psig). For a dielectric film of silicon dioxide, the low temperature cure may be done in the presence of a crosslinking agent such as an oxygen source such as oxygen or ozone deionized (DI) water or steam at a partial pressure required for a silicon dioxide film (e.g., 50 percent steam). In some cases, curing the dielectric film precursor(s) and optional one or more oligomerization agent in an oxygen-rich environment may help to reduce silicon-nitrogen (Si—N) bonds and/or silicon-hydrogen (Si—H) bonds present after deposition of the dielectric film precursors. That is, in some instances, the presence of silicon-hydrogen (Si—H) bonds may be decreased significantly (e.g., due to their relatively lower bond energy in an oxygen-based curing treatment) and silicon-oxygen (Si—O) bond intensity may increase significantly and come to replace the silicon-nitrogen (Si—N) bonds present in the dielectric film precursor(s). Thus, in some cases, as-deposited dielectric precursor(s) can be converted to a stable oxide, such as silicon dioxide ($SiO_2$). For a dielectric film of silicon nitride, the low temperature cure may be done in an ammonia or nitrogen atmosphere as a crosslinking agent, optionally in an atmosphere free of oxygen (e.g., an inert atmosphere). For a dielectric film of silicon carbide, the low temperature cure may be done in an inert atmosphere (e.g., nitrogen or argon) with a carbon-containing crosslinking agent such as a silane precursor such as trisilapentane (TSP) or an ionized gas such as methane.

In a second phase of curing, the dielectric film is subjected to a high temperature anneal at a pressure above atmospheric pressure (block 240, FIG. 5). In one embodiment, the second phase is performed to render the dielectric film thermodynamically stable. A representative temperature is on the order of 400° C. to 600° C. A representative pressure is greater than 15 psig (about 1536 torr) and, in another embodiment is greater than 100 psig (about 5931 torr) or between 100 psig and 375 psig (about 20,153 torr) and, in another embodiment, is between 150 psig (about 3517 torr) and 300 psig (about 16,274 torr). Again without wishing to be bound by theory, it is believed the increased pressure along with the temperature drives the reaction toward complete conversion, including to complete conversion, of the dielectric film precursor(s) to dielectric film 110. By driving the reaction of the precursor(s) toward complete conversion (complete crosslinking), the film properties of dielectric film 110 in trench 106 are more consistent throughout the film. In some cases, the second phase cure may serve, at least in part, to crosslink dielectric film 110 throughout the film. In some instances, this may help to ensure that resultant dielectric film 110 can withstand subsequent processing (e.g., etching, planarization, etc.). However, as will be appreciated in light of this disclosure, it may be desirable to ensure that the crosslinking of dielectric film 110 is not made so excessive as to prevent or otherwise overly inhibit etching thereof. That is, in some instances, it may be desirable to ensure that dielectric film 110 is sufficiently resistant, for example, to wet etching (e.g., by a hydrofluoric, or HF, acid-based wet etch chemistry), to provide for desired etching thereof. In a more general sense, the crosslinking of dielectric film 110 can be customized as desired for a given target application or end-use, in accordance with some embodiments.

In the above embodiment, a two-phase cure is described. In another embodiment, a single-phase cure may be pursued. A representative single-phase relatively high pressure cure of a dielectric film such as described is a cure at a temperature in the range of 100° C. to 600° C. and a pressure of 15 psig (about 1536 torr) to 375 psig (about 20,153 torr) (block 250, FIG. 5). The single-phase cure may proceed for a period to achieve a desired crosslinking of dielectric film 110 (e.g., 2 hours or more).

Figure 3:
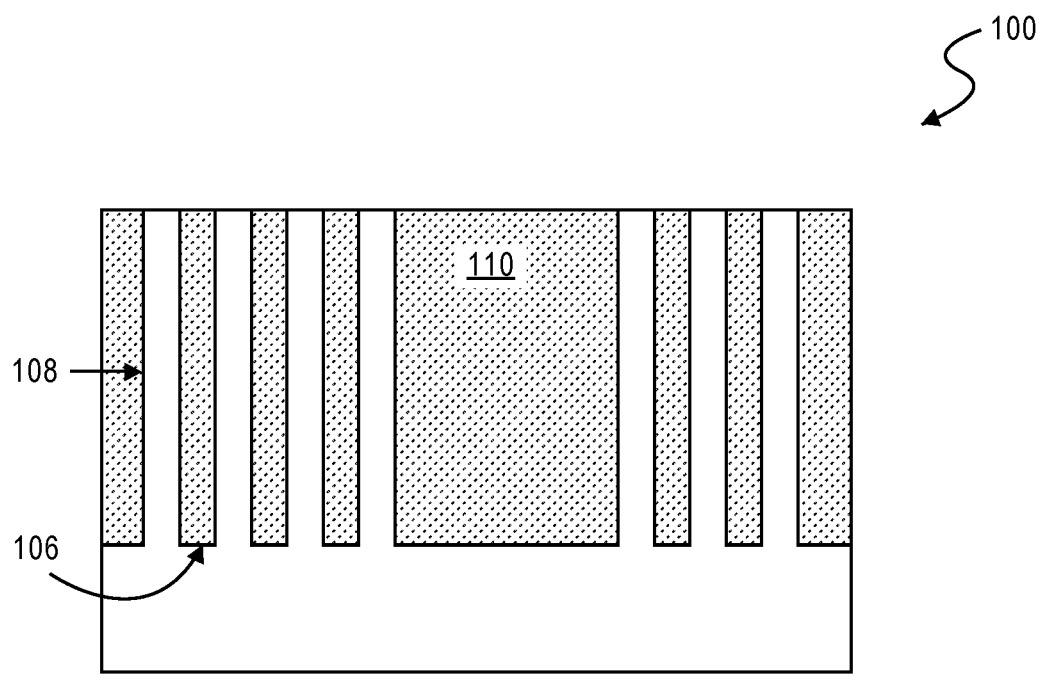
FIG. 3 shows the structure of FIG. 2 after planarization of the structure.

FIG. 3 shows the structure of FIG. 2 after planarization, of the structure. As will be appreciated in light of this disclosure, it may be desirable in some instances to planarize structure 100, for example, to remove any undesired: (1) excess of dielectric film 110; (2) remainder of patterned hardmask layer 104; and/or (3) excess of the one or more semiconductor bodies or fins 108 of substrate 102. To that end, structure 100 may undergo, for example: a chemical-mechanical planarization (CMP) process; an etch-and-clean process; and/or any other suitable planarization/polish process, as will be apparent in light of this disclosure. Other suitable techniques for planarizing structure 100 will depend on a given application and will be apparent in light of this disclosure.

In one embodiment, following planarization of the structure, semiconductor bodies or fins 108 of substrate 102 may be removed and replaced with another material such as another semiconductor material. Suitable materials include one or more semiconductor materials such as silicon germanium (SiGe) or a group III-V compound semiconductor material. In one embodiment, semiconductor bodies or fins 108 are replaced with multiple semiconductor materials, such as a buffer or sub-fin material or materials and an intrinsic material where such intrinsic material may serve as a channel material for a device formed in and on semiconductor bodies or fins 108. A suitable buffer or sub-fin material includes, but is not limited to, one or more of germanium, silicon germanium (SiGe) or a group III-V compound material such as gallium arsenide (GaAs), indium phosphide (InP), gallium phosphide (GaP), gallium arsenide antimony (GaAsSb), indium aluminum arsenide (InAlAs) and gallium antimony (GaSb). A suitable intrinsic material includes, but is not limited to, germanium, silicon germanium (SiGe) or indium gallium arsenide (InGaAs). Semiconductor bodies or fins 108 may be removed by a lithographic process wherein a mask is patterned on a surface of dielectric film 110 leaving semiconductor bodies or fins 108 exposed followed by an etch process to remove the fins. Semiconductor bodies or fins 108 of a silicon material may be etched by a dry or wet etch or a combination of the two. Suitable etchants for etching semiconductor bodies or fins 108 of a silicon material include potassium hydroxide (KOH) and tetramethylammonium hydroxide (TMAH). The removal of semiconductor bodies or fins forms trenches into which the buffer or sub-fin materials and intrinsic materials may be introduced.

Figure 4:
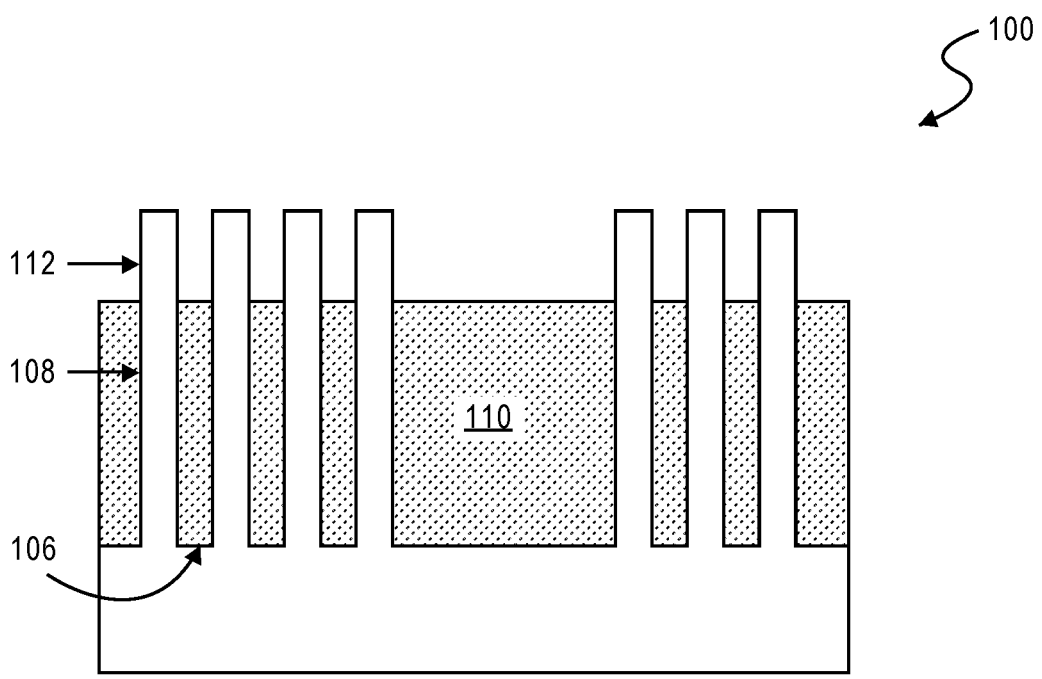
FIG. 4 shows the structure of FIG. 3 after recessing the dielectric film 110.
Figure 5:
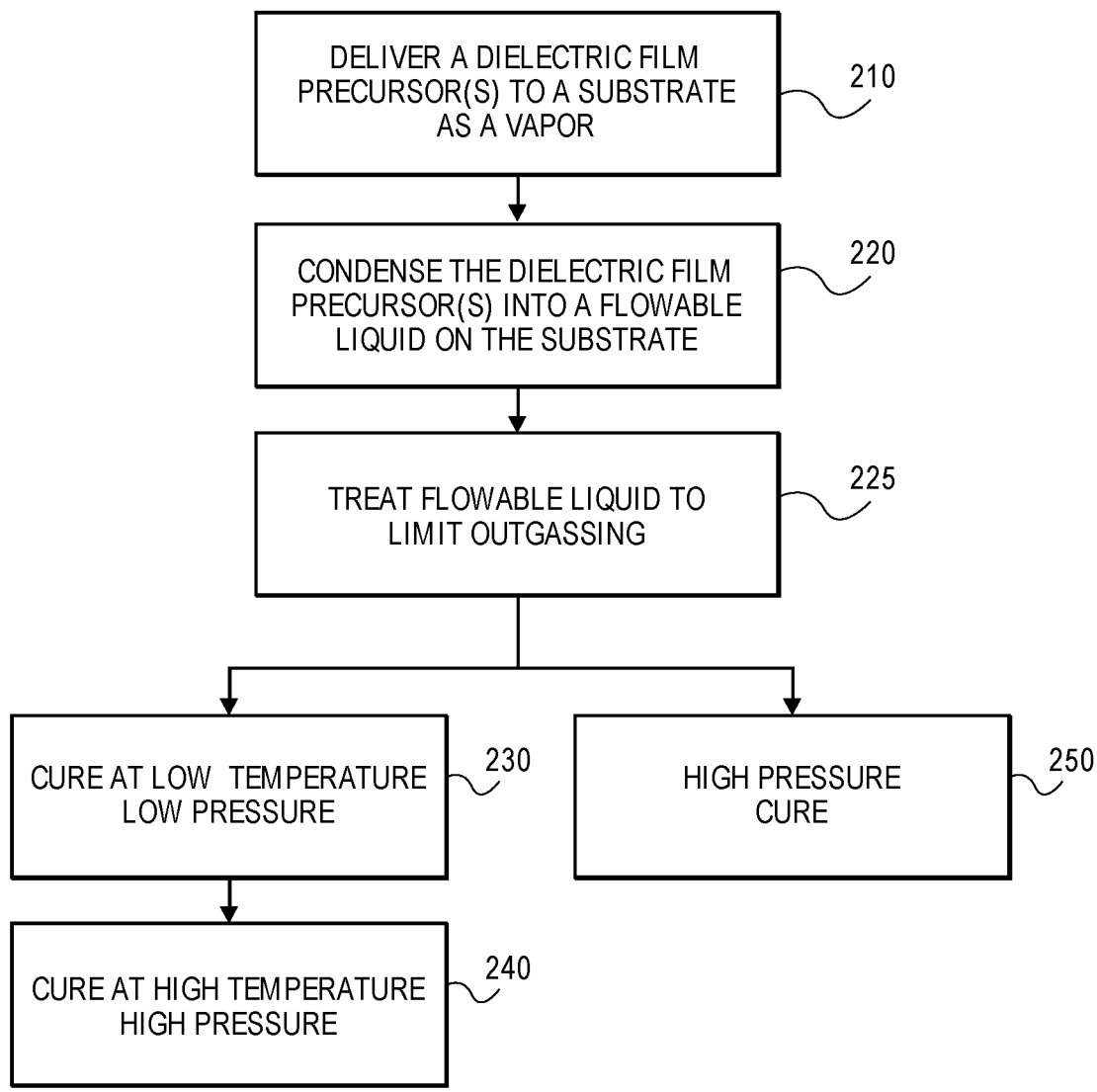
FIG. 5 is a flowchart of a process for forming a dielectric film.

FIG. 4 shows the structure of FIG. 3 after recessing dielectric film 110. Dielectric film 110 can be recessed using any suitable technique (or combination of techniques). For example, in accordance with some embodiments, dielectric film 110 may be recessed, for example, using a chemical (e.g., remote plasma-based) dry etch process. In accordance with some other embodiments, dielectric film 110 may be recessed, for example, using a hydrofluoric acid (HF) acid-based wet etch chemistry. Recessing of dielectric film 110 may help to reduce its thickness, thereby exposing one or more active portions 112 of the one or more semiconductor bodies or fins 108. As noted, semiconductor bodies or fins 108 can be of a material of substrate 102 or a replacement semiconductor material or materials. Exposed active portion 112 of a given semiconductor body or fin 108 may be available for downstream use or further processing. For example, active portion 112 may provide a structure upon which an additional layer and/or component can be populated, in accordance with some embodiments. Thus, in a general sense, recessing of dielectric film 110 may help to define the active fin area of structure 100, and dielectric film 110 may provide isolation between active fin devices, in accordance with some embodiments. The amount by which dielectric film 110 may be recessed can be customized as desired for a given target application or end-use, and, as will be appreciated in light of this disclosure, the dimensions of the active portion(s) 112 of structure 100 may depend, at least in part, on the recessing of dielectric film 110. Other suitable techniques for recessing dielectric film 110 will depend on a given application and will be apparent in light of this disclosure.

In the above embodiments, a method of introducing and formation of a dielectric film in relation to, for example, shallow trench isolation material is described. It is appreciated that the method may be applied to an introduction and formation of a dielectric film in other applications including, but not limited to, dielectric gap-fill applications. In the above embodiments, methods were described that included a use of an elevated pressure to promote crosslinking either through a two-phase curing process or a single-phase curing process. In another embodiment, a curing process can be performed at ambient pressure or less (e.g., vacuum) particularly where a dielectric film has been treated to inhibit outgassing prior to the curing phase.

Figure 6:
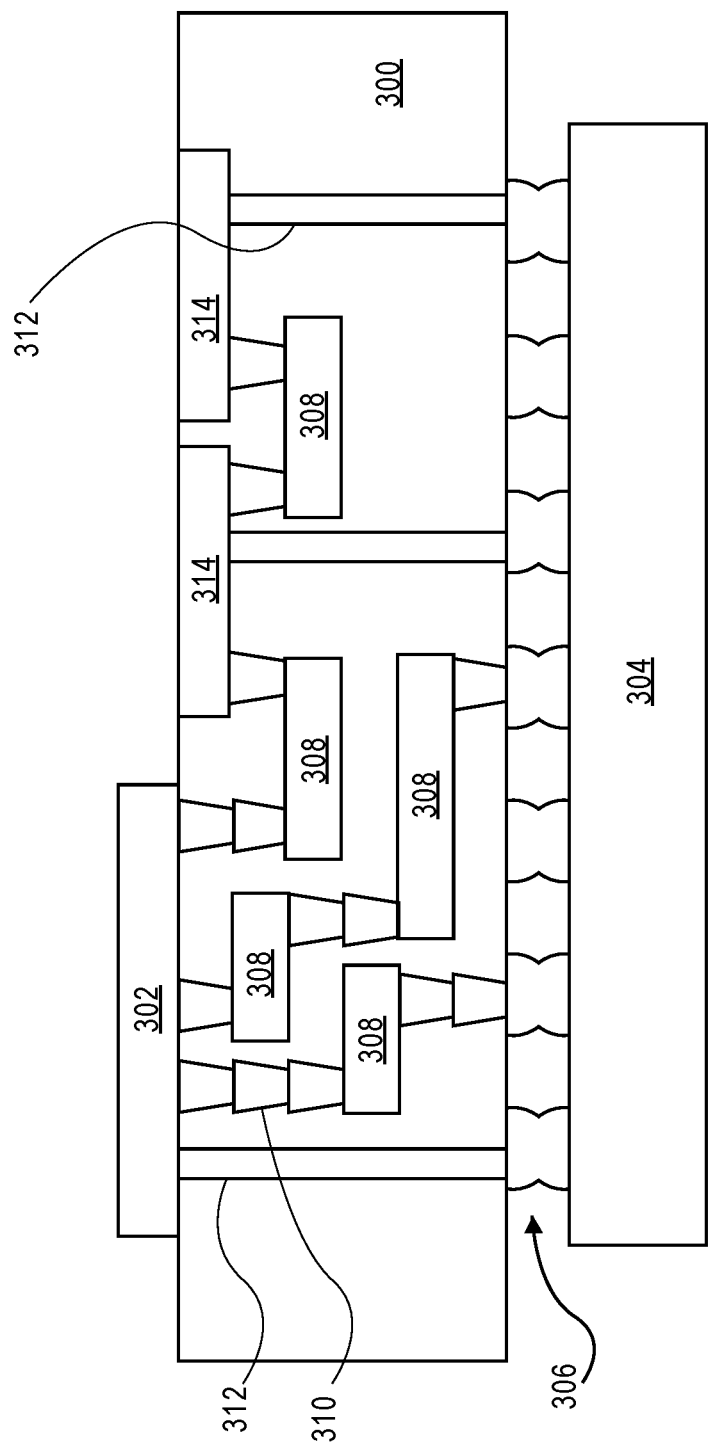
FIG. 6 is an interposer implementing one or more embodiments.

FIG. 6 illustrates interposer 300 that includes one or more embodiments. Interposer 300 is an intervening substrate used to bridge a first substrate 302 to second substrate 304. First substrate 302 may be, for instance, an integrated circuit die. Second substrate 304 may be, for instance, a memory module, a computer motherboard, or another integrated circuit die. Generally, the purpose of interposer 300 is to spread a connection to a wider pitch or to reroute a connection to a different connection. For example, interposer 300 may connect an integrated circuit die to ball grid array (BGA) 306 that can subsequently be connected to second substrate 304. In some embodiments, first and second substrates 302/304 are attached to opposing sides of interposer 300. In other embodiments, first and second substrates 302/304 are attached to the same side of interposer 300. In further embodiments, three or more substrates are interconnected by way of interposer 300.

Interposer 300 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 308 and vias 310, including but not limited to through-silicon vias (TSVs) 312. Interposer 300 may further include embedded devices 314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 300.

In accordance with embodiments, dielectric films and processes for their manufacture disclosed herein may be used in the fabrication of interposer 300.

Figure 7:
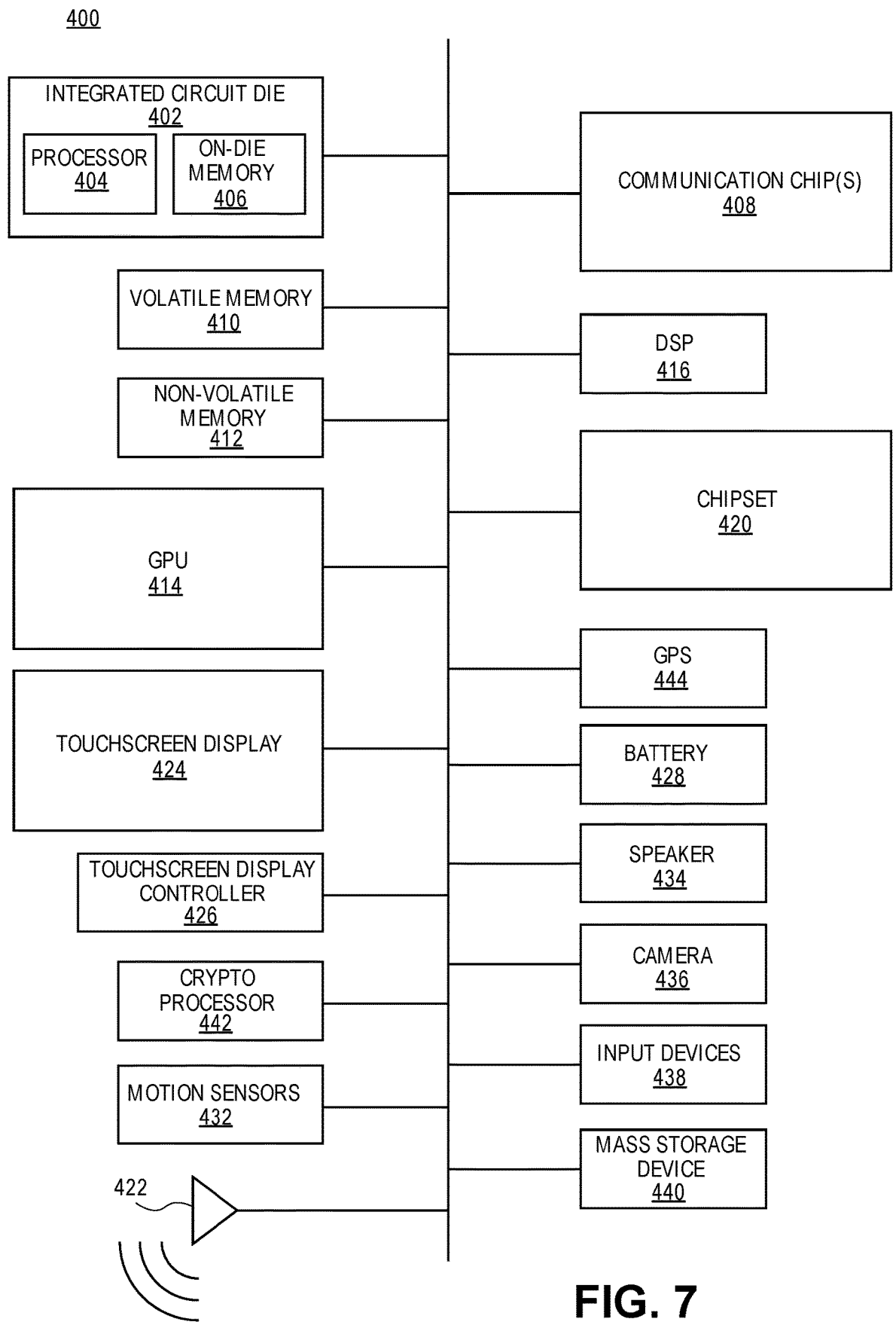
FIG. 7 illustrates an embodiment of a computing device.

FIG. 7 illustrates computing device 400 in accordance with one embodiment. Computing device 400 may include a number of components. In one embodiment, these components are attached to one or more motherboards. In an alternate embodiment, these components are fabricated onto a single system-on-a-chip (SoC) die rather than a motherboard. The components in computing device 400 include, but are not limited to, integrated circuit die 402 and at least one communication chip 408. In some implementations communication chip 408 is fabricated as part of integrated circuit die 402. Integrated circuit die 402 may include CPU 404 as well as on-die memory 406, often used as cache memory, that can be provided by technologies such as embedded DRAM (eDRAM) or spin-transfer torque memory (STTM or STTM-RAM).

Computing device 400 may include other components that may or may not be physically and electrically coupled to the motherboard or fabricated within an SoC die. These other components include, but are not limited to, volatile memory 410 (e.g., DRAM), non-volatile memory 412 (e.g., ROM or flash memory), graphics processing unit 414 (GPU), digital signal processor 416, crypto processor 442 (a specialized processor that executes cryptographic algorithms within hardware), chipset 420, antenna 422, display or a touchscreen display 424, touchscreen controller 426, battery 428 or other power source, a power amplifier (not shown), global positioning system (GPS) device 444, compass 430, motion coprocessor or sensors 432 (that may include an accelerometer, a gyroscope, and a compass), speaker 434, camera 436, user input devices 438 (such as a keyboard, mouse, stylus, and touchpad), and mass storage device 440 (such as hard disk drive, compact disk (CD), digital versatile disk (DVD), and so forth).

Communications chip 408 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 408 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 408. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 404 of computing device 400 includes one or more devices, such as transistors or metal interconnects, that are isolated with dielectric films or layers formed in accordance with embodiments presented above. The term "processor" may refer to any device or portion of a device that processes electronic data from registers and/or memory to transform that electronic data into other electronic data that may be stored in registers and/or memory.

Communication chip BB08 may also include one or more devices, such as transistors or metal interconnects, that are isolated with dielectric films or layers formed in accordance with embodiments presented above.

In further embodiments, another component housed within computing device BB00 may contain one or more devices, such as transistors or metal interconnects, that are isolated with dielectric films or layers formed in accordance with implementations presented above.

In various embodiments, computing device BB00 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device BB00 may be any other electronic device that processes data.

EXAMPLES

Example 1 is a flowable chemical vapor deposition method including depositing a dielectric film precursor on a substrate, wherein on the substrate, the dielectric film precursor is in a flowable form; depositing an oligomerization agent on the substrate; forming a dielectric film from the dielectric film precursor; and curing the dielectric film under a pressure greater than atmospheric pressure.

In Example 2, curing of the method of Example 1 includes curing under a pressure of 100 psig or greater.

In Example 3, curing of the method of Example 1 includes curing under a pressure in a range of 150 psig to 375 psig.

In Example 4, curing of the method of any of Examples 1-3 includes curing at an elevated temperature.

In Example 5, an elevated temperature of the method of Example 4 is 400° C. or greater.

In Example 5, an elevated temperature of the method of Example 4 is in a range of 400° C. to 600° C.

In Example 7, curing the dielectric film of the method of Example 5 includes a second curing and, prior to the second curing of the dielectric film, the method includes first curing of the dielectric film at a temperature less than 400° C. and a pressure less than 100 psig for a predetermined period of time.

In Example 8, curing the dielectric film of any of the methods of Examples 1-7 includes curing in the presence of a crosslinking agent.

Example 9 is a flowable chemical vapor deposition method including depositing a dielectric film precursor as a liquid on a substrate in the presence of an oligomerization agent; treating the deposited dielectric film precursor to inhibit outgassing; and curing the dielectric film precursor to form a dielectric film.

In Example 10, treating the dielectric film precursor to inhibit outgassing of the method of Example 9 includes crosslinking less than an entire deposited portion.

In Example 11, treating the dielectric film precursor to inhibit outgassing of the method of Example 10 includes one of oxidizing a portion of the dielectric film precursor, ultraviolet curing of a portion of the dielectric film precursor and subjecting the dielectric film precursor to high pressure.

In Example 12, treating the dielectric film precursor to inhibit outgassing of the method of Example 9 or 10 includes forming a semi-permeable crosslinked crust on the deposited liquid.

In Example 13, curing of any of the methods of Examples 9-12 includes curing under a pressure of 150 psig or greater.

In Example 14, curing of the method of Example 13 includes curing under a pressure in a range of 150 psig to 375 psig.

In Example 15, curing of the method of Example 13 includes curing at a temperature of 400° C. or greater.

In Example 16, curing the dielectric film precursor of any of the methods of Examples 9-15 includes a first curing at a temperature in the range of 100° C. and 400° C. and a pressure less than 100 psig for a predetermined period of time and a second curing at a pressure greater than 100 psig.

In Example 17, the first curing of the method of Example 16 includes a pressure in the range of 0 psig to 30 psig.

In Example 18, the second curing of the method of Example 16 includes a temperature of 400° C. to 600° C.

In Example 19, curing the dielectric film precursor of any of the methods of Examples 9-18 includes curing in the presence of a crosslinking agent.

Example 20 is a flowable chemical vapor deposition method including delivering a dielectric film precursor as a vapor to a substrate including gap structures between device features on the substrate; condensing the dielectric film precursor on the substrate to a liquid; flowing the liquid into the gap structures; and curing the dielectric film precursor under a pressure of 15 pounds per square inch gauge (psig) or greater.

In Example 21, the dielectric film precursor of the method of Example 20 is deposited in the presence of an oligomerization agent.

In Example 22, prior to curing, the method of Example 20 or 21 includes treating the deposited dielectric film precursor to inhibit outgassing In Example 23, treating the deposited dielectric film precursor to inhibit outgassing of the method of Example 22 includes crosslinking less than the entire the dielectric film precursor delivered to the substrate.

In Example 24, curing the dielectric film precursor of any of the methods of Examples 20-23 includes a first curing at a temperature in the range of 100° C. and 400° C. and a pressure less than 100 psig for a predetermined period of time and a second curing at a pressure greater than 100 psig.

In Example 25, the first curing of the method of Example 24 includes a pressure in the range of 0 psig to 30 psig.

In Example 26, the second curing of the method of Example 24 includes a temperature of 400° C. to 600° C.

In Example 27, curing of any of the methods of Examples 20-26 includes a temperature in the range of 100° C. to 600° C. and a pressure of 15 psig to 375 psig.

In Example 28, curing the dielectric film precursor of any of the methods of Examples 20-27 including curing in the presence of a crosslinking agent.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A flowable chemical vapor deposition method comprising:
   depositing a dielectric film precursor on a substrate, wherein on the substrate, the dielectric film precursor is in a flowable form;
   depositing an oligomerization agent on the substrate;
   forming a dielectric film from the dielectric film precursor; and
   curing the dielectric film under a pressure greater than atmospheric pressure.

2. The method of claim 1, wherein curing comprises curing under a pressure of 100 psig or greater.

3. The method of claim 1, wherein curing comprises curing under a pressure in a range of 150 psig to 375 psig.

4. The method of claim 1, wherein curing comprises curing at an elevated temperature.

5. The method of claim 4, wherein an elevated temperature is 400° C. or greater.

6. The method of claim 5, wherein curing the dielectric film comprises a second curing and, prior to the second curing of the dielectric film, the method comprises first curing of the dielectric film at a temperature less than 400° C. and a pressure less than 100 psig for a predetermined period of time.

7. The method of claim 4, wherein an elevated temperature is in a range of 400° C. to 600° C.

8. The method of claim 1, wherein curing the dielectric film comprises curing in the presence of a crosslinking agent.

9. A flowable chemical vapor deposition method comprising:
   depositing a dielectric film precursor as a liquid on a substrate in the presence of an oligomerization agent;
   treating the deposited dielectric film precursor to inhibit outgassing, wherein treating the deposited dielectric film precursor comprises forming a semi-permeable skin or crust on the deposited dielectric film precursor, the semi-permeable skin or crust formed from the deposited dielectric film precursor; and
   curing the dielectric film precursor to form a dielectric film.

10. The method of claim 9, wherein treating the dielectric film precursor to inhibit outgassing comprises crosslinking less than an entire deposited portion.

11. The method of claim 10, wherein treating the dielectric film precursor to inhibit outgassing comprises one of oxidizing a portion of the dielectric film precursor, ultraviolet curing of a portion of the dielectric film precursor and subjecting the dielectric film precursor to high pressure.

12. The method of claim 9, wherein forming the semi-permeable skin or crust comprises forming a semi-permeable crosslinked crust.

13. The method of claim 9, wherein curing comprises curing under a pressure of 150 psig or greater.

14. The method of claim 13, wherein curing comprises curing under a pressure in a range of 150 psig to 375 psig.

15. The method of claim 13, wherein curing comprises curing at a temperature of 400° C. or greater.

16. The method of claim 9, wherein curing the dielectric film precursor comprises a first curing at a temperature in the range of 100° C. and 400° C. and a pressure less than 100 psig for a predetermined period of time and a second curing at a pressure greater than 100 psig.

17. The method of claim 16, wherein the first curing comprises a pressure in the range of 0 psig to 30 psig.

18. The method of claim 16, wherein the second curing comprises a temperature of 400° C. to 600° C.

19. The method of claim 9, wherein curing the dielectric film precursor comprises curing in the presence of a crosslinking agent.

20. A flowable chemical vapor deposition method comprising:
   delivering a dielectric film precursor as a vapor to a substrate comprising gap structures between device features on a substrate;
   condensing the dielectric film precursor on the substrate to a liquid;
   flowing the liquid into the gap structures; and
   curing the dielectric film precursor under a pressure of 15 pounds per square inch gauge (psig) or greater.

21. The method of claim 20, wherein the dielectric film precursor is deposited in the presence of an oligomerization agent.

22. The method of claim 20, wherein, prior to curing, the method comprises treating the deposited dielectric film precursor to inhibit outgassing.

23. The method of claim 22, wherein treating the deposited dielectric film precursor to inhibit outgassing comprises crosslinking less than the entire the dielectric film precursor delivered to the substrate.

24. The method of claim 20, wherein curing the dielectric film precursor comprises a first curing at a temperature in the range of 100° C. and 400° C. and a pressure less than 100 psig for a predetermined period of time and a second curing at a pressure greater than 100 psig.

25. The method of claim 24, wherein the first curing comprises a pressure in the range of 0 psig to 30 psig.

26. The method of claim 24, wherein the second curing comprises a temperature of 400° C. to 600° C.

27. The method of claim 20, wherein curing comprises a temperature in the range of 100° C. to 600° C. and a pressure of 15 psig to 375 psig.

28. The method of claim 20, wherein curing the dielectric film precursor comprises curing in the presence of a crosslinking agent.

29. A flowable chemical vapor deposition method comprising:
   depositing a dielectric film precursor as a liquid on a substrate in the presence of an oligomerization agent;
   treating the deposited dielectric film precursor to inhibit outgassing; and
   curing the dielectric film precursor to form a dielectric film, wherein curing comprises curing under a pressure of 150 psig or greater.

30. A flowable chemical vapor deposition method comprising:
   depositing a dielectric film precursor as a liquid on a substrate in the presence of an oligomerization agent;
   treating the deposited dielectric film precursor to inhibit outgassing; and
   curing the dielectric film precursor to form a dielectric film, wherein curing the dielectric film precursor comprises a first curing at a temperature in the range of 100° C. and 400° C. and a pressure less than 100 psig for a predetermined period of time and a second curing at a pressure greater than 100 psig.

* * * * *